United States Patent
Kokubo et al.

(10) Patent No.: US 6,414,895 B2
(45) Date of Patent: Jul. 2, 2002

(54) SEMICONDUCTOR MEMORY DEVICE WITH REDUCED STANDBY CURRENT

(75) Inventors: Nobuyuki Kokubo; Kiyoyasu Akai, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/748,271

(22) Filed: Dec. 27, 2000

(30) Foreign Application Priority Data

Jul. 17, 2000 (JP) ........................................ 2000-215452

(51) Int. Cl.[7] .................................................. G11C 8/00
(52) U.S. Cl. ........................ 365/227; 365/226; 365/229
(58) Field of Search ................................ 365/226, 227, 365/228, 229

(56) References Cited

U.S. PATENT DOCUMENTS 5,521,527 A * 5/1996 Sakata et al. .................. 326/21
5,982,705 A * 11/1999 Tsukikawa ............. 365/230.08
6,038,183 A * 3/2000 Tsukude ...................... 365/201
6,288,963 B1 * 9/2001 Kato ........................... 365/222

FOREIGN PATENT DOCUMENTS

| JP | 5-314790 | 11/1993 |
| JP | 410011993 A | * 1/1998 |
| JP | 2000339961 A | * 12/2000 |

* cited by examiner

Primary Examiner—Viet Q. Nguyen
(74) Attorney, Agent, or Firm—McDermott, Will & Emery

(57) ABSTRACT

A current limiter includes: a P type MOS transistor electrically coupled between a main power potential supply line supplying power supply potential Vcc and a power potential supply line; and a level converter generating a control signal of signal levels in an operating state and a standby state, respectively, corresponding to a ground potential Vss and an intermediate potential Vhh (Vss<Vhh<Vcc) adjustable externally. The control signal is inputted into the gate of the transistor. The transistor supplies a sufficient operating current for ensuring an operating margin and a standby current of a prescribed value or less satisfying a requirement for lower power consumption onto the power potential supply line in the operating state and the standby state, respectively.

20 Claims, 10 Drawing Sheets

SEMICONDUCTOR MEMORY DEVICE WITH REDUCED STANDBY CURRENT

BACKGROUND OF THE INVENTION

1. Field of the Invention

The present invention relates to a semiconductor memory device and particularly, to a static semiconductor memory device capable of reducing a standby current.

2. Description of the Background Art

Random access memories, a memory device into which data can be written, stored and read in a nonsequential manner, are classified into a dynamic random access memory (DRAM) in which cells require a refresh operation for holding a stored data and a static random access memory (SRAM) with no need of the refresh operation, in a broad sense.

Since SRAM has a complex structure and a high cost per each unit capacity as compared with DRAM, but requires no refresh operation, SRAM contains a feature that data can be read and written at high speed. For such a reason, SRAM is used in a cash memory requiring a comparably fast operation in a high speed CPU (a central processing unit) or the like. Especially, in recent years, SRAM has found its wide application in a battery-driven portable terminal equipment and others, using a feature of its comparably low power consumption.

FIG. 14 is a circuit diagram representing an example configuration of a memory cell of SRAM. In FIG. 14, shown is a so-called CMOS memory cell constructed of six MOS transistors.

Referring to FIG. 14, MOS transistors QP1, QP2, QN1 and QN2 constitute two CMOS inverters for holding signal levels at storage nodes Nm and /Nm. Writing and reading datas onto or from the storage node Nm and /Nm are performed in such a manner that access transistors QN3 and QN4 responsive to activation (H level) of a word line WL are turned on and thereby, the storage node Nm and /Nm are coupled to bit lines BL and /BL, respectively.

When a word line WL is inactivated (L level) and access transistors QN3 and QN4 are turned off, MOS transistors of different conductivity types in the respective CMOS inverters are turned on according to data levels held in the storage nodes Nm and /Nm. Thereby, the storage nodes Nm and JNm couple selectively with a power supply potential Vcc corresponding to H level of a data and the ground potential Vss corresponding to L level of a data, respectively, in this order or in the reverse way thereof according to a level of a data held in a memory cell. By doing so, a data can be held in a memory cell with no periodical refresh operation following turning on of a word line WL.

FIG. 15 is a circuit diagram representing another example configuration of a SRAM.

In FIG. 15, a storage nodes Nm and /Nm are coupled with the power supply potential Vcc through high resistance loads R1 and R2, respectively. Access transistors N type MOS transistors QN1 and QN2 are electrically coupled between the storage node Nm and the ground potential Vss, and between the storage node /Nm and the ground potential Vss, respectively.

Writing and reading of datas onto and from the storage nodes Nm and /Nm are, similar to the case of FIG. 14, are performed by coupling the storage nodes Nm and /Nm with bit lines BL and /BL, respectively, through turning on of the access transistors QN3 and QN4 responsive to activation (H level) of a word line WL.

In a case where the word line WL is inactivated (L level) and the access transistors QN3 and QN4 are turned off, one of the transistors QN1 and QN2 is turned on according to data levels held in the storage nodes Nm and /Nm, and thereby, the storage nodes Nm and /Nm are selectively set to the power supply potential Vcc and the ground potential Vss, respectively, in this order or in the reverse way, according to a level of a data stored in a memory cell. By doing so, potential levels of the storage nodes Nm and /Nm are held even in the standby state.

As shown in FIGS. 14 and 15, the power supply potential Vcc and the ground potential Vss are all the time supplied to a SRAM memory cell. In order to efficiently supply the power supply potential Vcc and the ground potential Vss to memory cells arranged in a matrix, lines supplying the potentials are generally placed along a row or column direction.

FIGS. 16 and 17 are block diagrams representing an example and another example, respectively, of placement of power supply lines in a SRAM memory array.

Referring to FIG. 16, memory cells MC are arranged in a matrix of (n+1) rows and (m+1) columns, where n and m are a natural number. Word lines are placed along the respective rows corresponding thereto. In an entire memory cell array MCA, word lines WL0 to WLn are placed along respective (n+1) memory cell rows corresponding thereto.

Bit line pairs are likewise placed along respective memory cell columns corresponding thereto. A bit line pair is constituted of two data lines carrying complementary datas thereon. For example, a bit line pair BLP0 is constituted of bit lines BL0 and /BL0. The bit line /BL0 carries a data of an opposite polarity from that of a data transmitted on the bit lime BL0. In the entire memory cell array MCM, bit line pairs BLP0 to,BLPm are placed along respective (m+1) memory cell columns corresponding thereto.

In FIG. 16, shown is a configuration in which power supply lines are placed along respective memory cell rows corresponding thereto. That is, the power supply lines 100-0 to 100-n are placed along the respective memory cell rows corresponding thereto. The power supply lines 100-0 to 100-n are coupled with a main power supply line 70 supplying the power potential Vcc.

In a configuration of FIG. 16, power supply lines can be placed corresponding to respective sets of a plurality of memory cell rows as well in this case, for example, one power supply line is allocated to each pair of two memory cell rows or each set of 3 memory cell rows.

In FIG. 17, shown is a configuration in which power supply lines are placed along a memory cell column direction. Referring to FIG. 17, power potential supply lines 100-0 to 100-m for transmitting the power supply potential Vcc to the respective memory cells MC are provided along the respective memory cell columns corresponding thereto. The power potential supply lines 100-0 to 100-m are coupled with the main power supply line 70.

In a configuration of FIG. 17, power supply lines are placed corresponding to respective sets of a plurality of memory cell columns as well.

As shown in FIGS. 16 and 17, when the power supply lines are provided along a row or column direction of the memory cells, the power supply potential Vcc can be efficiently supplied to each of the memory cells in a memory cell array. Though detailed description is omitted, lines supplying the ground potential Vss to each of the memory cells MC through a main ground line 80 are arranged, similar to the power potential supply lines.

However, since, in a SRAM memory cell, the power supply potential Vcc and the ground potential Vss are supplied all the time, a current flows in the memory cell all the time when a short-circuit current path arises between the power supply potential Vcc and the ground potential Vss due to a defect.

Such a defective memory cell can be replaced for repairing with a spare memory cell provided in advance from the viewpoint of data storage. Even when a defective memory cell has been replaced for repairing, however, a short circuit current produced between the power supply potential Vcc and the ground potential Vss in the defective memory cell continues to flow.

Therefore, when a SRAM memory is mounted on an information terminal equipment or the like and a small operating current is required especially in a standby state, a defective memory cell in which a short circuit current path is present cannot be saved, which causes an obstacle against ensuring product yield of SRAM.

SUMMARY OF THE INVENTION

It is accordingly an object of the present invention to provide a static semiconductor memory device capable of suppressing a current consumed in a standby state even when a defective memory cell containing a short-circuit current path between a power supply potential and a ground potential arises.

The present invention will be summarized: the present invention is directed to a semiconductor memory device having an operating state to perform reading and writing data and a standby state to hold a data, includes: a plurality of memory cells; a main power supply line; a first power supply line; a second power supply line; and a current limiter. The plurality of memory cells are arranged in a matrix and each memory cell holds a data, receiving a first potential and a second potential corresponding to a high level and a low level, respectively, of the data. The main power supply line supplies the first potential. The first power supply line is placed in each of sections among the plurality of memory cells to supply the first potential to memory cells in the corresponding section. The second power supply line supplies the second potential to the plurality of memory cells. The current limiter is provided between the main power supply line and the first power supply line in order to limit a current amount passing through the first power supply line below a prescribed value in the standby state.

Accordingly, a main advantage of the present invention is in that a current consumed in the standby state is suppressed to a prescribed value or lower such that a standard value of power consumption in a semiconductor device can be met even when a defective memory cell in which a short-circuit path is caused between the first and second power supply lines arises and replacement saving becomes necessary.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Detailed description will be given of an embodiment of the present invention below with reference to the accompanying drawings, wherein the same reference marks represent the same parts or corresponding parts in the figures.

First Embodiment

Figure 1:
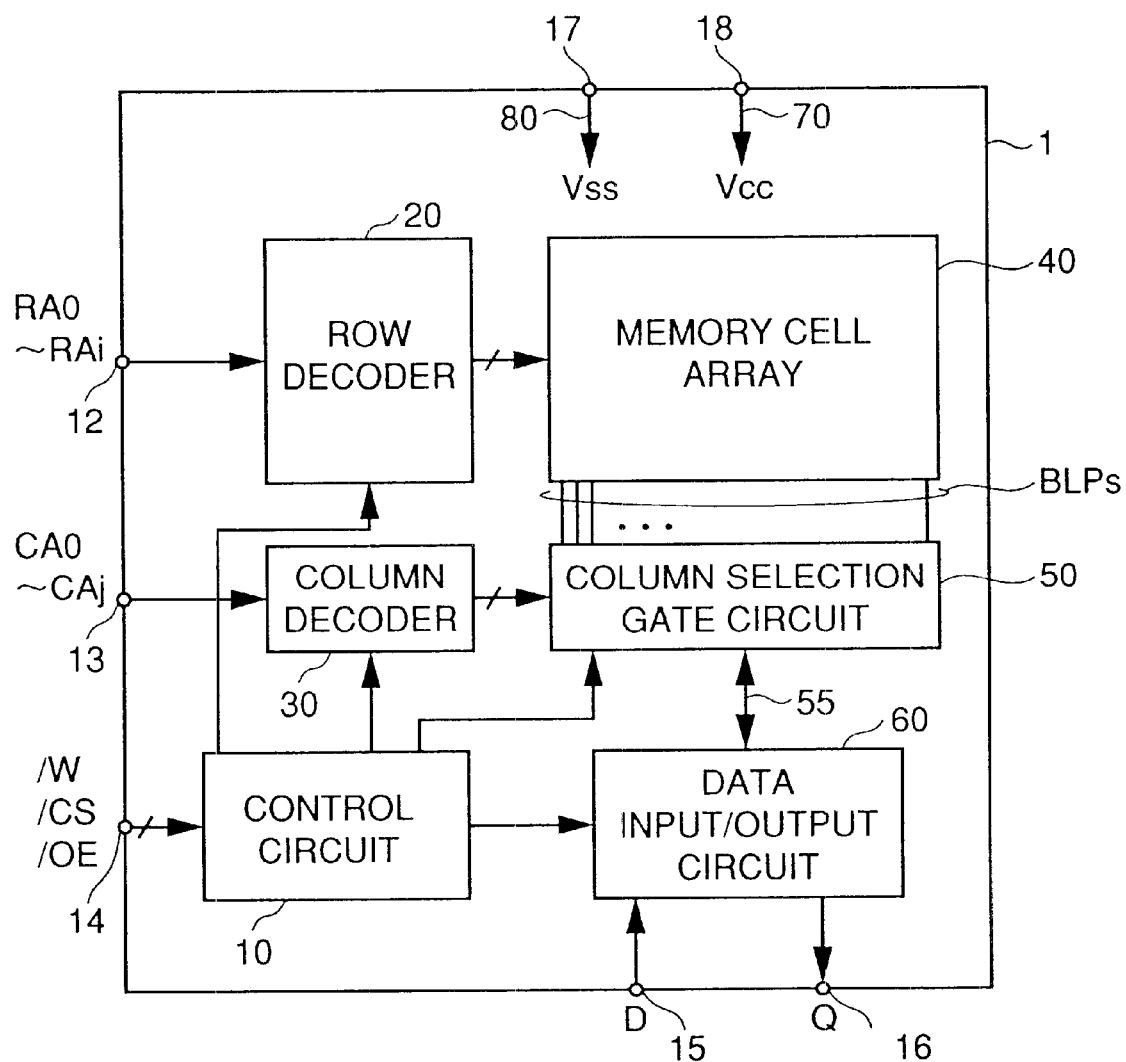
FIG. 1 is a schematic block diagram showing a configuration of a semiconductor memory device 1 according to a first embodiment of the present invention.

A semiconductor memory device 1 according to the embodiment of the present invention shown in FIG. 1 is a static memory device capable of holding a stored data with performing no refresh operation, represented by a SRAM.

Referring to FIG. 1, the semiconductor memory device 1 includes: a row address terminal 12 receiving a row address signal RA0 to RAi, where i is a natural number; a column address terminal 13 receiving a column address signal CA0 to CAj, where j is a natural number; a control signal terminal 14 receiving control signals, such as a read/write control signal /W, a chip select signal /CS and an output enable signal /OE; a data input terminal 15 receiving an input data D; a data output terminal 16 outputting an output data Q; and a power terminals 17 and 18 receiving a ground potential Vss and a power supply potential Vcc. The power supply potential Vcc and the ground potential Vss are transmitted to internal circuits of the semiconductor memory device 1 through a main power supply line 70 and a main ground line 80, respectively.

The semiconductor memory device 1 further includes: a control circuit 10 controlling an internal operation of the semiconductor memory device 1; a memory cell array 40 containing a plurality of memory cells arranged in a matrix; a row decoder 20 performing selection of a memory cell row, decoding a row address signal RA0 to RAi; a column decoder 30 performing selection of a memory cell column, decoding a column address signal CA0 to CAj; a column selection gate circuit 50 coupling one of a bit line pair group BLPs provided along the respective memory cell columns corresponding thereto with a data I/O line 55; and a data input/output circuit 60 performing receiving and sending of data between the data I/O line 55 and the data input terminal 15, and between the data I/O line 55 and the data output terminal 16.

Though detail is not shown the data input/output circuit 60 includes a write driver for writing an input data D into a memory cell 40 through the data I/O line 55, an amplifier circuit for amplifying a read data transmitted onto the data I/O line 55; and others.

The semiconductor memory device 1 has two states when power is turned on: an operating state of performing a read and write operations of datas on a memory cell selected by an address signal and a standby state of performing data holding in each memory cell.

Figure 2:
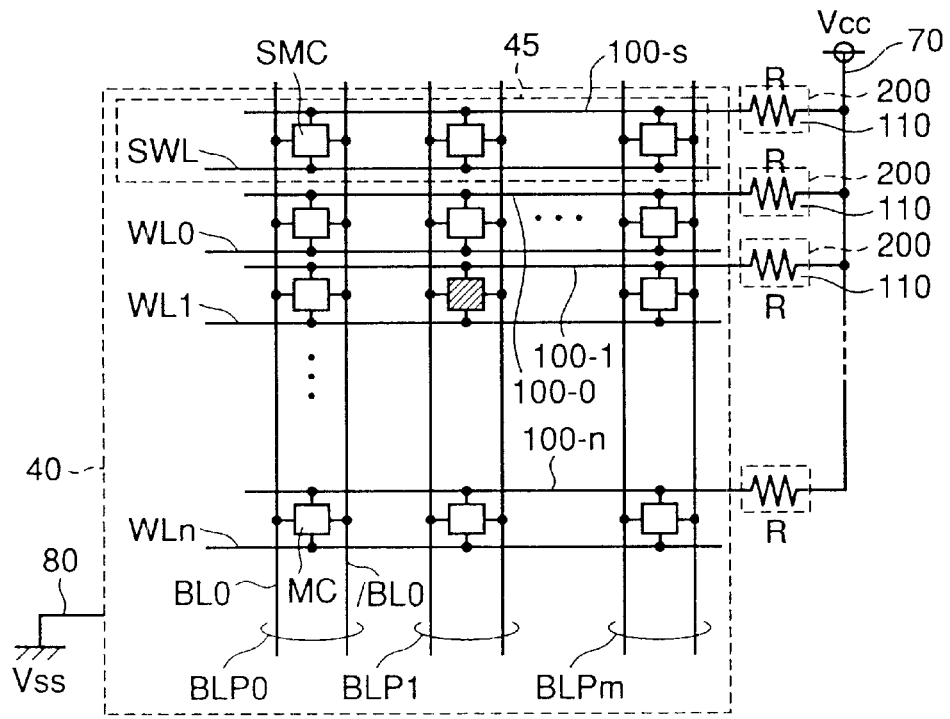
FIG. 2 is a circuit diagram explaining a configuration of a memory cell array 40 of FIG. 1.

Referring to FIG. 2, the memory cell array includes: normal memory cells MC arranged in a matrix of (n+1) rows and (m+1) columns; and spare memory cells SMC constituting a spare memory cell row 45 placed along a row direction adjacent to the normal memory cell group. Hereinafter, the normal memory cells MC and the spare memory cells SMC are also simply referred to memory cells in a collective manner.

Figure 14:
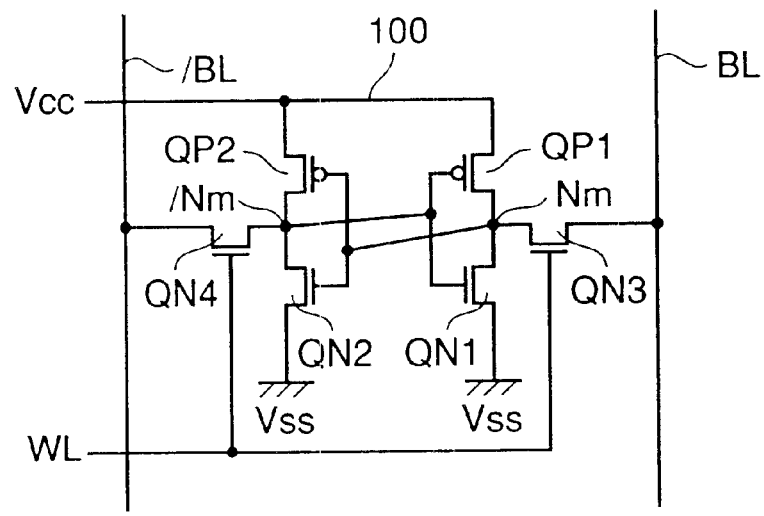
FIG. 14 is a circuit diagram representing an example configuration of a SRAM memory cell.
Figure 15:
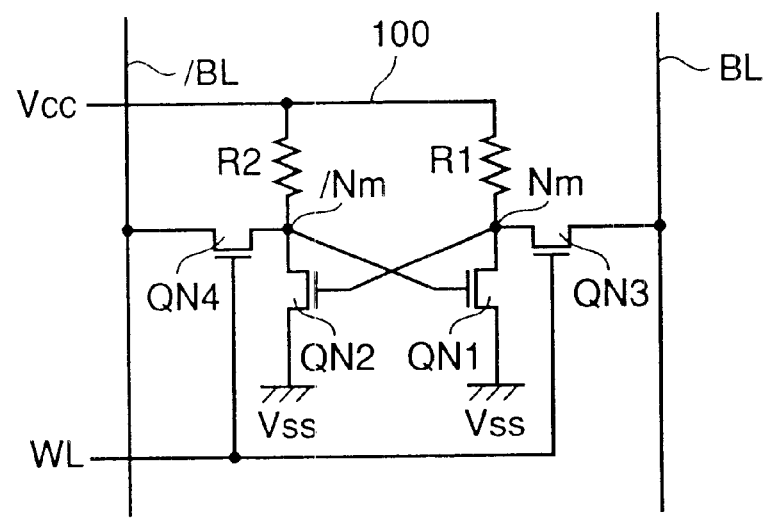
FIG. 15 is a circuit diagram representing another example configuration of a SRAM memory cell.
Figure 16:
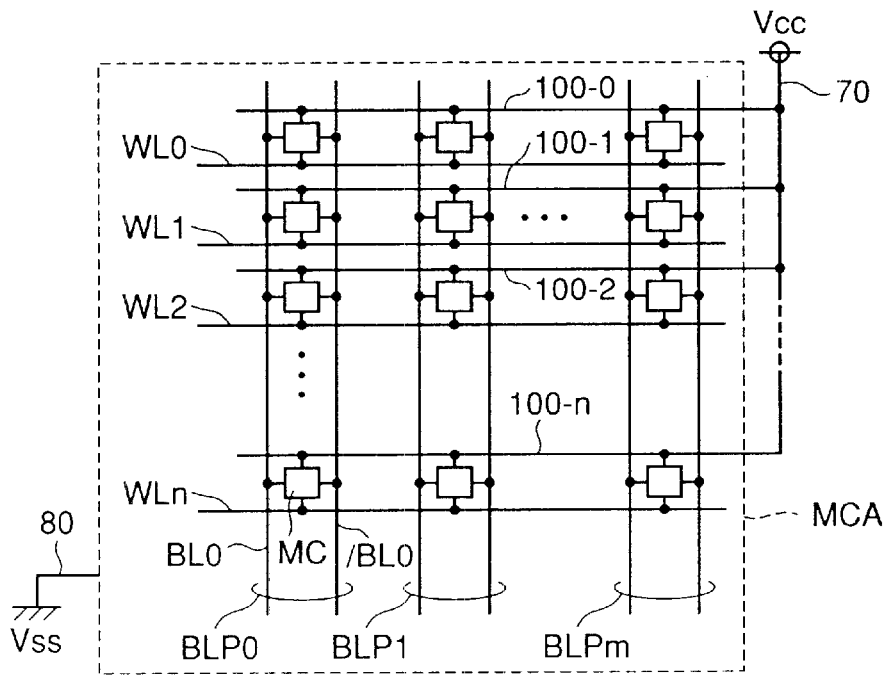
FIG. 16 is a block diagram representing an example arrangement of power potential supply lines in a SRAM memory array.
Figure 17:
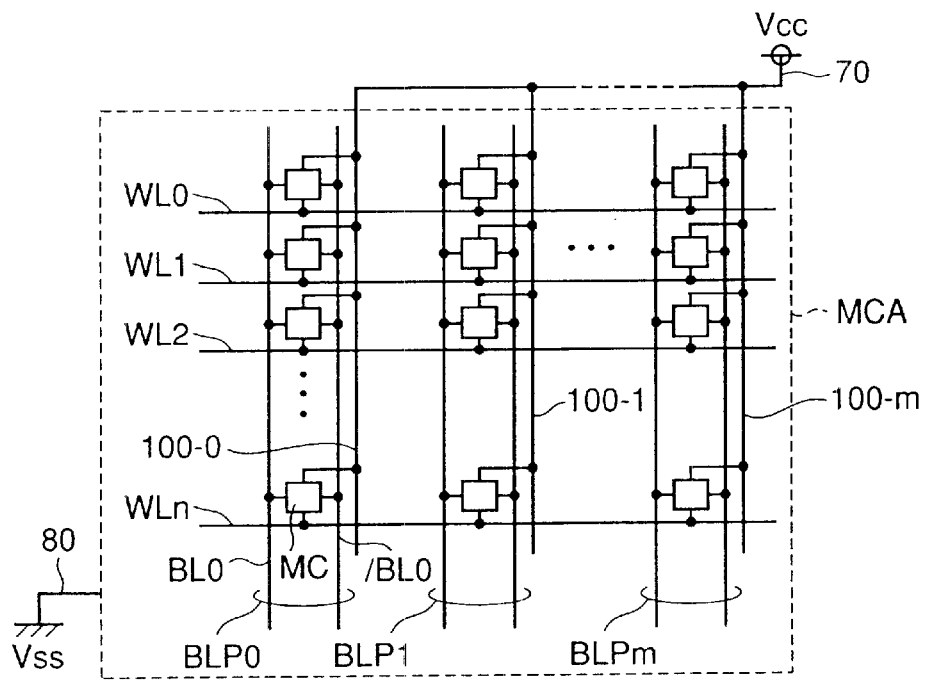
FIG. 17 is block diagram representing another example arrangement of power potential supply lines in a SRAM memory array.

A configuration of a memory cell generally adopted in a static semiconductor memory device may be adopted in each of the memory cells and for example, a CMOS memory cell and a high load resistance memory cell shown in FIGS. 14 and 15 can be applied.

Word lines WL0 to WLn are placed along respective (n+1) normal cell rows corresponding thereto and a spare ward line SWL is placed along a spare memory cell row corresponding thereto. The normal memory cells MC and the spare memory cells SMC are arranged so as to share memory cell columns and bit line pairs BLP0 to BLPm are placed along respective (m+1) memory cell columns. The whole of the bit line pairs BLP0 to BLPm corresponds to the bit line pair group BLPs shown in FIG. 1.

In static memory cells, the power supply potential Vcc and the ground potential Vss are required to be supplied to each memory cell. In a semiconductor memory device according to the embodiment of the present invention, one power potential supply line is provided for each of sections of the memory cell array. In FIG. 2, a configuration is shown in which each section is a memory cell row and power supply lines are placed along the respective memory cell rows corresponding thereto. That is, for the entire memory cell array 40, power supply lines 100-0 to 100-n and 100-s are placed along the respective memory cell rows corresponding thereto in direction along a memory cell row.

Further, though details are not shown, the ground potential Vss is supplied to each of memory cells through a main ground line 80. A way of arrangement of lines to directly supply the ground potential Vss is not specifically limited but any way may be allowed as far as the ground potential Vss can be supplied to each of the memory cells.

Current limiters 200 are provided between the main power supply line 70 and each of the power supply lines 100-0 to 100-n and 100s, respectively. The current limiters 200 have respective resistors 110.

A current limiter 200 is designed so as to set a current flowing through each of the power potential supply lines in the standby state, that is a standby current, to be a prescribed value or less and satisfy a requirement for reduction in power consumption in the standby state. For example, a resistance value R of a resistor 110 is determined depending on a difference between the power supply potential Vcc and the ground potential Vss and a standard value Ist of the standby current.

In a defective memory cell, even when a short-circuit current path is formed between the power supply potential Vcc and the ground potential Vss, the resistor 110 acts in series on the short-circuit current, and therefore, when the resistance value R is set such that Ist<(Vcc−Vss)/R, no chance is available that a standby current in the standby state exceeds (Vcc−Vss)/R. As a result, even when a short-circuit current path is formed between the power supply potential Vcc and the ground potential Vss, no standby current exceeds the standard value Ist.

As one example, a case is considered where a memory cell shadowed by oblique hatching shown in FIG. 2 corresponding to the word line WL1 becomes defective. Since, in the defective memory cell, a short-circuit current path is produced between the power supply line 100-1 supplying the power supply potential Vcc and a line supplying the ground potential Vss, a potential level of the power potential supply line 100-1 decreases in the vicinity of the ground potential Vss. As a result, data holding in a normal memory cell group connected to the word line WL1 is disabled.

However, even when a short-circuit current path is present in a defective memory cell, a current flowing through the power supply line 100-1 is limited by the current limiter 200, that is the resistor 110, and for this reason, the standby current never exceeds the standard value Ist.

Accordingly, when a memory cell row corresponding to the word line WL0 is replaced with a spare memory cell row 45 for repairing, the semiconductor memory device 1 performs a normal data holding operation and can satisfy the standard value of a standby current regardless of the presence of a defective memory cell, with the result that even when a defective memory cell arises in the semiconductor memory device 1, the device 1 can be repaired by replacement with a spare memory cell to be a good product.

As a replacement repairing method in this case, for example, a row address of a defective memory cell row corresponding to a defective memory cell is programmed in a non-volatile manner in the row decoder 20 and when the defective memory cell row is to be selected by a row address signal, the row decoder 20 is only required to activate a spare word line SWL instead of a word line corresponding to a normal memory cell.

In recent years, SRAMs, a representative example of a static semiconductor memory device, have been widely employed in the portable terminal equipment market and further progressed toward a larger capacity and therefore, to adopt a configuration enabling replacement repairing while suppressing a standby current in such a way is effective for ensuring production yield.

Figure 3:
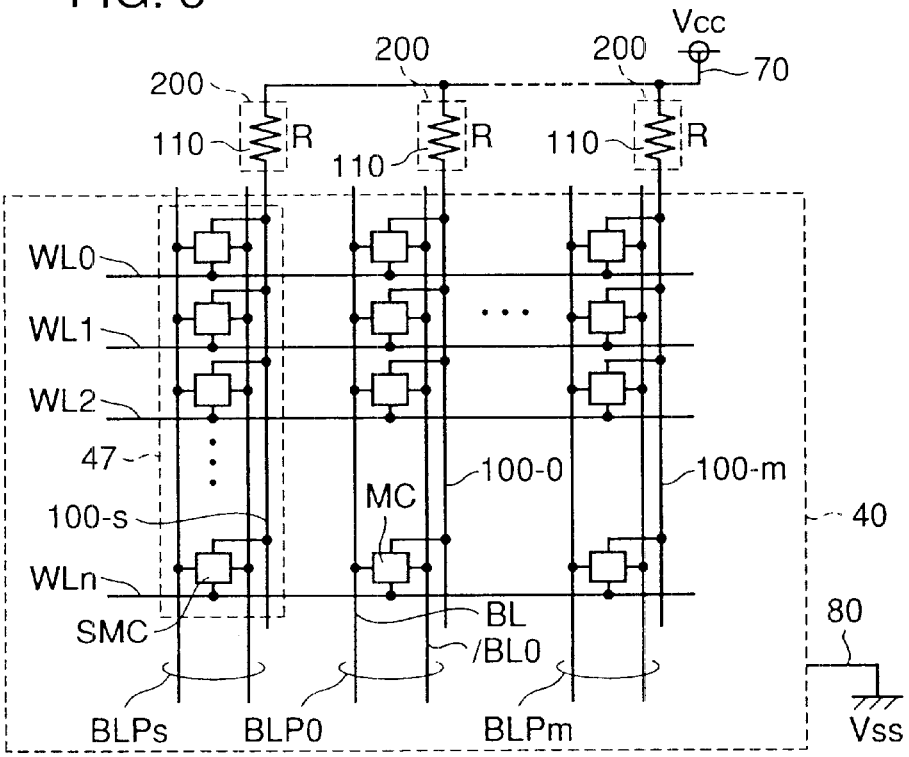
FIG. 3 is a circuit diagram representing another example configuration of a power potential supply line and a current limiter according to a first embodiment of the present invention.

In FIG. 3, a configuration is shown in which a section within a memory cell array corresponding to one power supply line is selected to be each memory cell column, and power supply lines are placed along respective memory cell columns corresponding thereto. Accordingly, for the entire memory cell 40, power supply lines 100-0 to 100-m are placed along the respective memory cell columns corresponding thereto in direction along a memory cell column. In the configuration of FIG. 3, spare memory cells SMC are arranged in a column direction so as to from a spare memory cell column 47 adjacent to a normal memory cell group. Therefore, replacement repairing of a defective memory cell is performed with one memory column as a unit.

Arrangement of lines for supplying the ground potential Vss to each of the memory cells MC is similar to in FIG. 2 and therefore, detailed representation by the figure is not shown.

Current limiters 200 are provided to the respective power supply lines 100-1 to 100-m, and 100-s corresponding thereto. Similar to the case of FIG. 2, each current limiter 200 has a resistor 110. With such a configuration, too, a similar effect of that described in FIG. 2 can be enjoyed.

In FIGS. 2 and 3, the configurations are shown in which one power supply line is provided to one memory cell column or one memory cell column, but a section corresponding to one power supply line can include a plurality of memory cell rows or a plurality of memory cell columns.

In the configurations shown in FIGS. 2 and 3, when a defective memory cell arises, a memory cell group corresponding to one power supply line is a unit for replacement repairing. Accordingly, a power supply line is required to be placed, in design, so as to be related to arrangement of spare memory cells.

Second Embodiment

Figure 4:
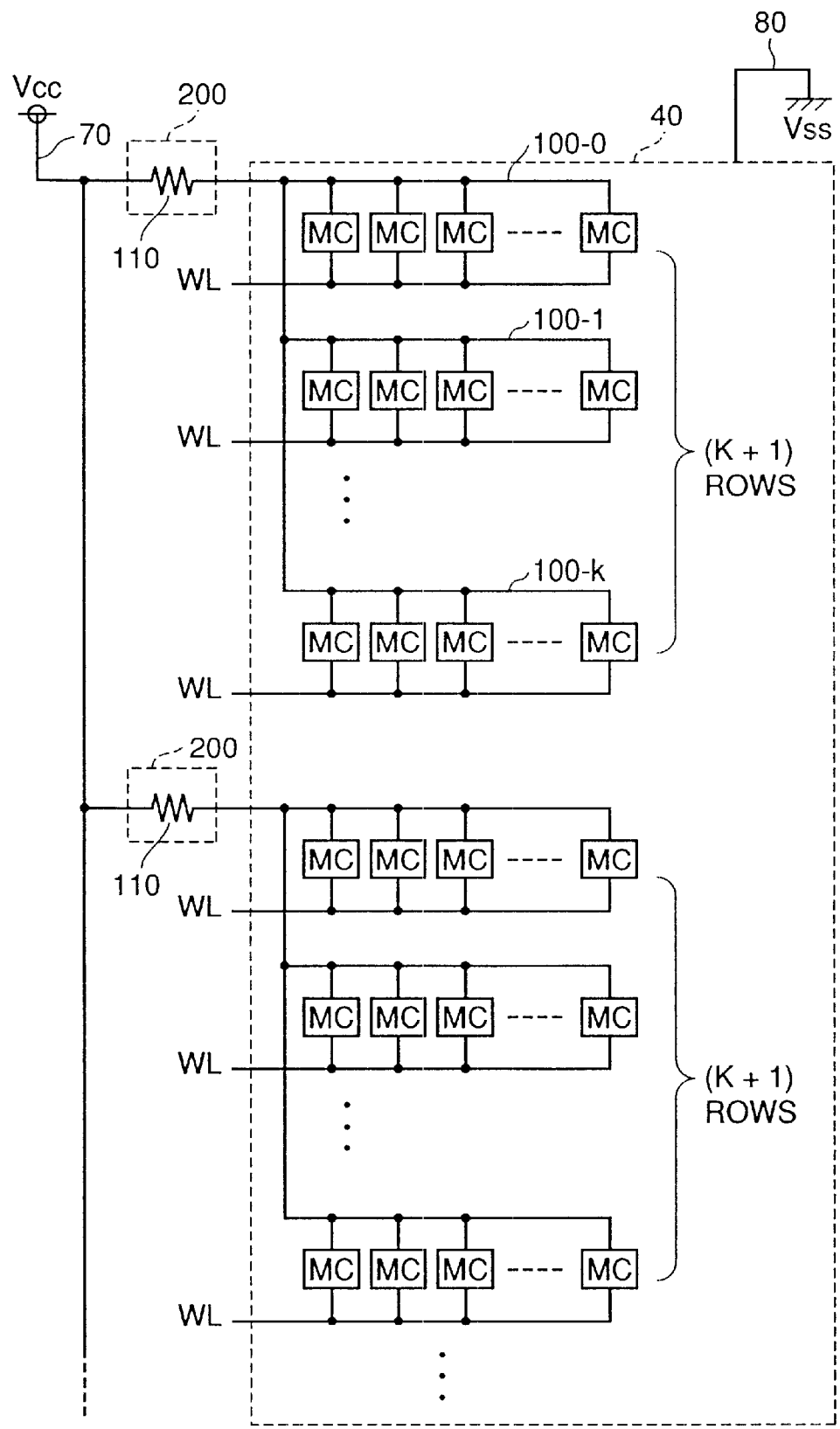
FIG. 4 is a conceptual circuit diagram representing arrangement of a power potential supply line and a current limiter according to a second embodiment of the present invention.

Referring to FIG. 4, in the second embodiment, one current limiter is provided to each set of a plurality of power supply lines. In FIG. 4, a section in a memory cell array corresponding to one power supply line is a memory cell row and one current limiter is provided to each set of (k+1) power supply lines, where k is a natural number.

A current limiter 200 is provided to a set of power supply lines 100-0 to 100-k corresponding to respective (k+1) memory cell rows. Likewise, another current limiter 200 is also provided to a another set of (k+1) power supply lines corresponding to respective (k+1) memory cell rows. The current limiters 200 each have a resistor 110, similar to that described in FIG. 2.

Even with such a configuration in which one current limiter is provided to a set of a plurality of power supply lines, a similar effect of that in the case of the first embodiment can be enjoyed when a resistance value of a resistor 110 is set taking into account a standard value for a standby current.

With such a configuration adopted, the number of current limiters 200, that is the number of resistors 110 can be reduced compared with a configuration in which current limiters are provided to respective power supply lines as shown in FIGS. 2 and 3, thereby enabling cost and a layout area to decrease.

In a configuration according to the second embodiment, when a defective memory cell arises, all of memory cell groups corresponding to a plurality of power supply lines coupled with the same current limiter are required to be replaced for repairing, with the result that the number of spare memory cells necessary to save a prescribed number of defective cells increases compared with the case in the first embodiment.

Though the second embodiment the configuration is described in which power supply lines are provided to respective memory cell rows, the number of resistors can be reduced with a configuration in which one current limiter is provided to each set of a plurality of power supply lines, each of which is provided to a plurality of memory cell rows or columns, or one memory column.

Third Embodiment

In the third and fourth embodiments, description will be given of other configurations of a current limiter.

While in the following description, one of power supply lines is taken up as a representative and description is directed to configuration variations of a current limiter corresponding to the one power supply line, the configuration variations can be applied in any cases with a similar effect regardless of arrangement of power potential lines. That is, the present invention can be applied to cases where power supply lines are provided to respective memory cell rows or respective memory cell columns, or respective sets of a plurality of memory cell rows or respective sets of a plurality of memory cell columns.

Figure 5:
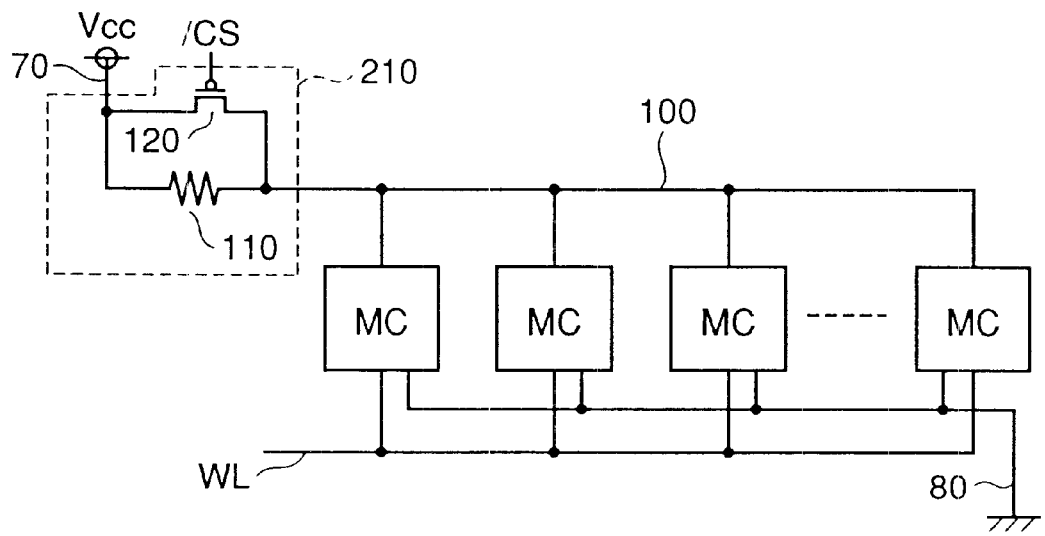
FIG. 5 is a circuit diagram representing a configuration of a current limiter 210 according to a third embodiment of the present invention.

Referring to FIG. 5, a current limiter 210 according to the embodiment includes: a resistor 110 connected between a main power supply line 70 and a power supply line 100; and a P type MOS transistor 120 connected in parallel to the resistor 110. A control signal /CS is inputted to the gate of the transistor 120.

The control signal /CS is a signal corresponding to the standby state or the operating state of the semiconductor memory device 1. The control signal /CS is inactivated (H level at the power supply potential Vcc) in the standby state but activated (L level at the ground potential Vss) in the operating state.

Accordingly, in the standby state, the transistor 120 is turned off and current supply from the main power supply line 70 to the power supply line 100 is performed by the resistor 110 similar to the case of the first embodiment. That is, a standby current is determined by a resistance value R of the resistor 110.

When in the operating state, a supply current onto the power potential supply line 100 is excessively small and thereby, a potential level of the power supply line 100 decreases, there arises an inconvenience such as reduction in operating speed in each memory cell. Therefore, in the third embodiment, in the operating state, the transistor 120 is turned on and an operating current is supplied to the power potential supply line 100 through the resistor 110 and the transistor 120 both.

With such a configuration, similar to the case of the first embodiment, not only is a standby current flowing onto the power supply line 100 suppressed even when a defective memory cell arises, but an operating current can be also sufficiently supplied onto the power supply line 100 in the operating state.

First Modification of the Third Embodiment

Figure 6:
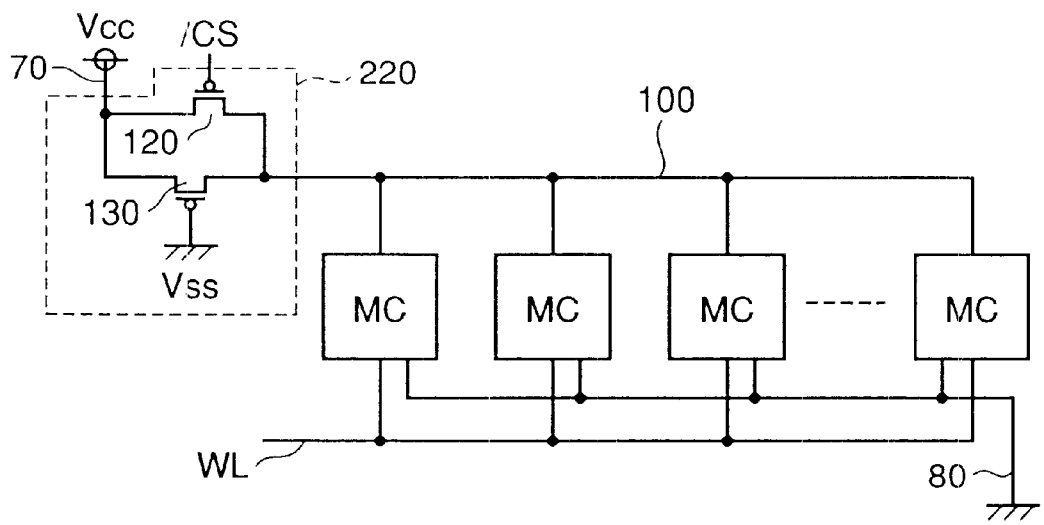
FIG. 6 is a circuit diagram representing a configuration of a current limiter 220 according to a first modification of the third embodiment.

Referring to FIG. 6, a current limiter 220 according to the first modification of the third embodiment includes: P type MOS transistors 120 and 130 connected in parallel to each other between a main power supply line 70 and a power supply line 100. A control signal /CS is inputted to the gate of the transistor 120 similar to the case of FIG. 5. On the other hand, the gate of the transistor 130 is coupled with the ground potential Vss corresponding to the active state (L level) of the control signal /CS and kept in the on state all the time.

Therefore, in the standby state, a standby current is supplied onto the power supply line 100 by the transistor 130, while in the operating state, the standby current is supplied onto the power supply line 100 by both of the transistors 120 and 130. Since in the current limiter 220, a current is supplied onto the power supply line 100 by the two transistors 120 and 130, current driving capabilities of the transistors 120 and 130 are properly designed in terms of a transistor size, taking into consideration ensuring of an operating margin in the operating state and lower consumption in the standby state.

With such a configuration, for example, even when a standard value for a standby current is severe and therefore, it is hard to, in layout, provide a resistor 110 having a necessary resistance value for satisfying a requirement of low consumption in the standby state, the standby current can be suppressed by adjustment of current driving capability through a change in transistor size or the like means.

Second Modification of the Third Embodiment

Figure 7:
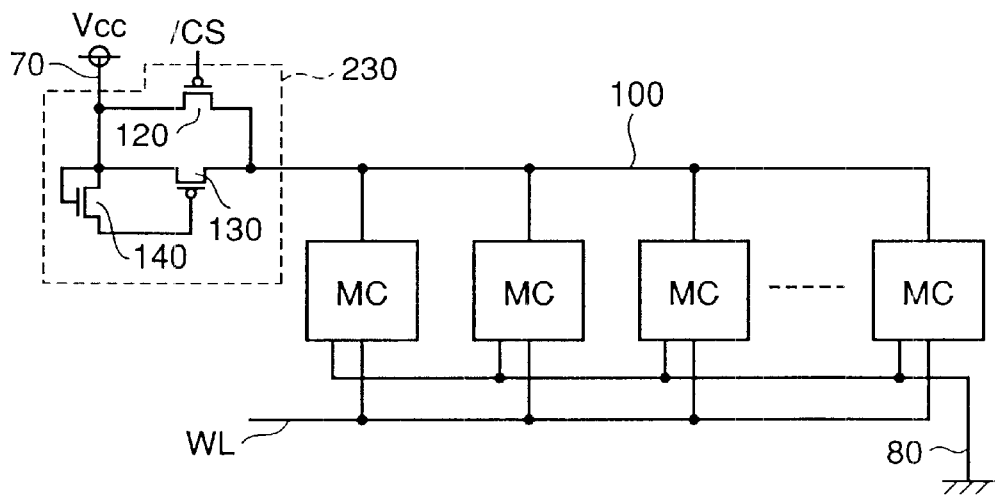
FIG. 7 is a circuit diagram representing a configuration of a current limiter 230 according to a second modification of the third embodiment.

Referring to FIG. 7, a current limiter 230 according to the second modification of the third embodiment includes: P type MOS transistors 120 and 130 connected in parallel between a main power supply line 70 and a power supply line 100; and an N type MOS transistor 140 electrically coupled between the main power supply line 70 and the gate of the transistor 130. The gate of a transistor 140 is coupled with the main power supply line 70.

With such a configuration, to the gate of the transistor 130, an intermediate potential lower than the power supply potential Vcc and higher than the ground potential Vss. When an intermediate potential applied to the gate of the transistor 130 is properly adjusted by changing a threshold value of the transistor 140 or its transistor size, a supply current onto the power supply line 100 from the main power supply line 70 in the standby state, that is a standby current, can be suppressed without depending on a transistor size of the transistor 130 only.

Hence, a standby current can be reduced without designing a transistor size of a extremely small size even in a semiconductor memory device of a type having a severe requirement for its low power consumption in the standby state.

Third Modification of the Third embodiment

Figure 8:
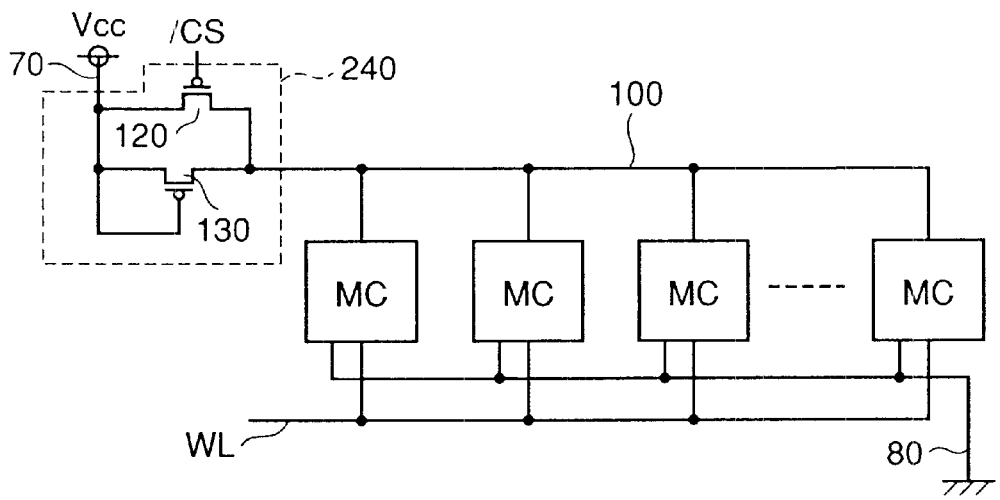
FIG. 8 is a circuit diagram representing a configuration of a current limiter 240 according to a third modification of the third embodiment.

Referring to FIG. 8, a current limiter 240 according to the third example modification of the third embodiment includes: P type MOS transistors 120 and 130 coupled in parallel between a main power supply line 70 and a power supply line 100. A control signal /CS is supplied to the gate of the transistor 120. The transistor 120 is designed so as to be able to supply a sufficient operating current in the operating state where the transistor 120 is turned on.

On the other hand, the gate of the transistor 130 is coupled to the power supply potential Vcc corresponding to the inactive state (H level) of the control signal /SC. The transistor 130 operates in the all time cutoff region (a subthreshold region) and thereby, a current supply to the power supply line 100 in the standby state is performed by a subthreshold current of the transistors 120 and 130 only.

Accordingly, when adjustment of a threshold voltage of the transistor 130, adoption of a depletion MOS transistor and others are done according to a current amount necessary in a memory cell array 40 in the standby state, then a desired standby current can be supplied by the transistor 130. For example, when a memory cell in the memory cell array 40 is constituted of a CMOS memory cell shown in FIG. 13, a standby current can be suppressed by decreasing a gate length of the P type MOS transistor 130 by 10% or more, or reducing a threshold voltage by 0.1 V, relative to a gate length and a threshold value, respectively, of a P type transistor in the memory cell.

Accordingly, when comparing with the current limiter 230 shown in FIG. 7, a standby current can be suppressed, even in a case where a resistor is difficult to be provided in layout, without providing an N type MOS transistor 140 generating an intermediate potential and without designing a current driving capability of the transistor 130, that is a transistor size thereof, so as to be extremely small. Further, when in the operating state, a sufficient operating current can be supplied by the transistor 120.

Fourth Embodiment

Figure 9:
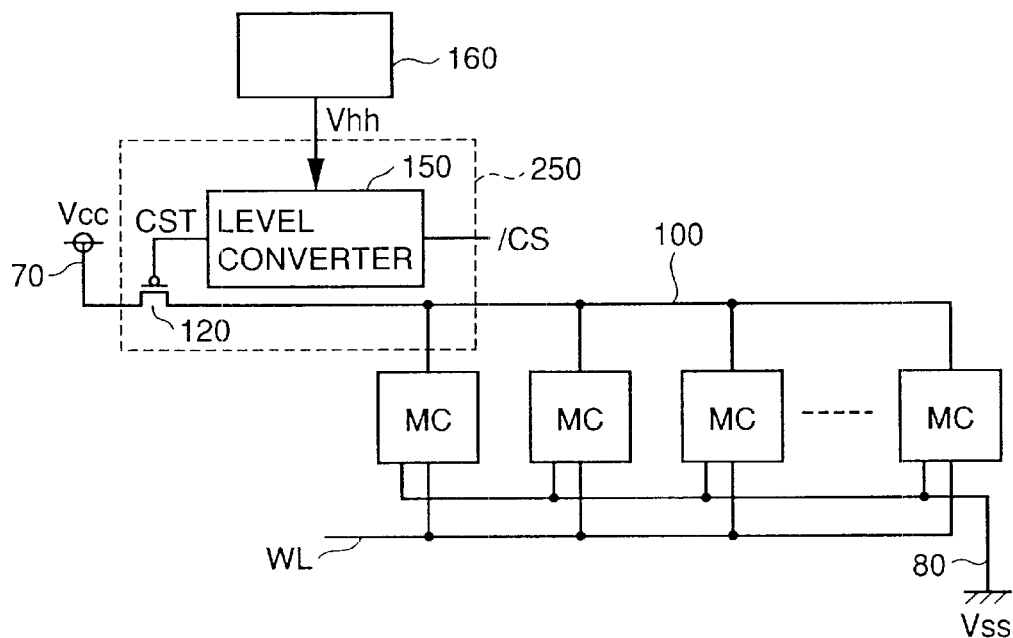
FIG. 9 is a circuit diagram representing a configuration of a current limiter 250 according to a fourth embodiment of the present invention.

Referring to FIG. 9 according to the fourth embodiment, a current limiter 250 according to the fourth embodiment includes: a P type MOS transistor 120 electrically coupled between a main power supply line 70 and a power supply line 100; and a level converter 150 generating a control signal CST inputted into the gate of the transistor 120 based on a control signal /CS.

Figure 10:
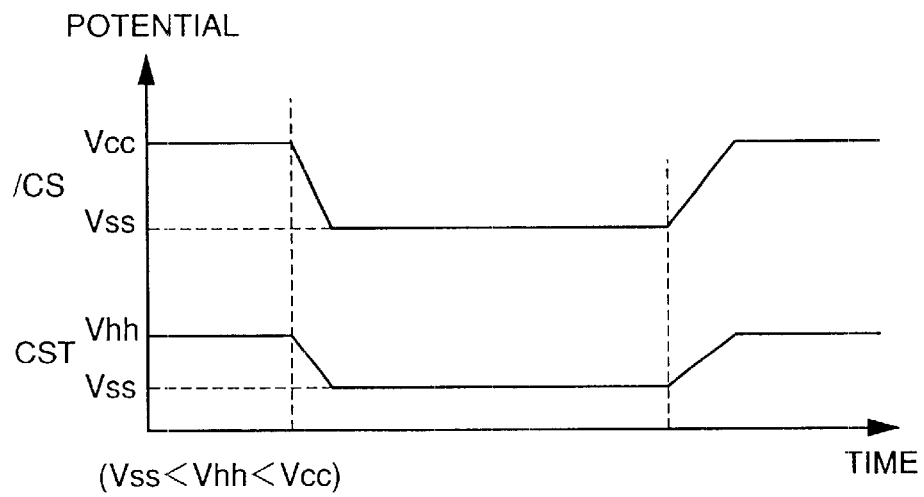
FIG. 10 is a timing chart explaining level transition of a control signal CST.

Referring to FIG. 10, the control signal CST is generated based on the control signal /CS whose signal level changes according to the standby state or operating state of a semiconductor memory device 1.

The control signal CST changes a signal level thereof at the same timing as that of the control signal /CS, while potential levels are different from each other in the inactive states (H level). That is, a H level potential of the control signal CST is set to an intermediate potential Vhh somewhere between the power supply potential Vcc and the ground potential Vss. In the fourth embodiment, the intermediate potential Vhh is a variable potential adjustable externally and produced by an intermediate potential generator 160.

Figure 11:
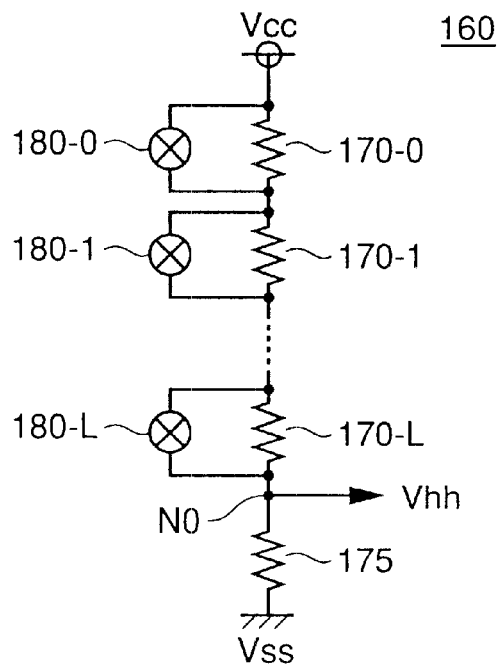
FIG. 11 is a circuit diagram representing an example configuration of an intermediate potential generator 160.

In FIG. 11, shown is a circuit configuration of the intermediate potential generator 160 in which trimming by fuses is employed.

Referring to FIG. 11, the intermediate potential generator 160 includes: a plurality of resistors 170-0 to 170-L and 175, wherein L is a natural number, coupled between the power supply potential Vcc and the ground potential Vss. The intermediate potential generator 160 further includes fuses 180-0 to 180-L connected in parallel to the respective resistors 170-0 to 170-L. The intermediate potential Vhh is generated at an output node N0 between the resistors 170-L and 175.

With such a configuration, a voltage drop produced between the power supply potential Vcc and the output node N0 is adjusted by effecting fuse cut on the fuses 180-0 to 180-L, thereby enabling achievement of a desired value of the intermediate potential Vhh (Vss<Vhh<Vcc).

Figure 12:
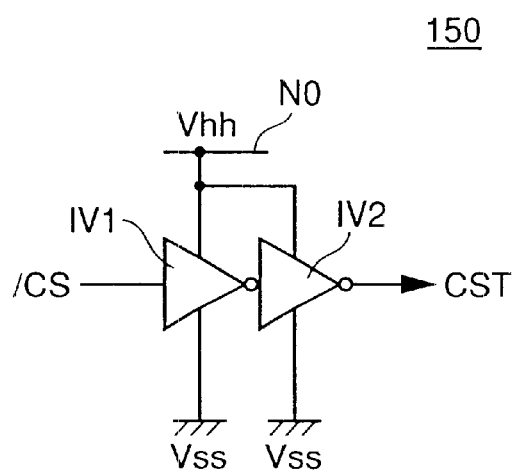
FIG. 12 is a circuit diagram representing an example configuration of a level converter 150.

Referring to FIG. 12, the level converter 150 includes: inverters IV1 and IV2 driven by the intermediate potential Vhh generated by the intermediate potential generator 160 and the ground potential Vss.

The inverter IV1 outputs one of the intermediate potential Vhh and the ground potential Vss according to a potential level of the control signal /CS. The inverter IV2 sets a signal level of the control signal CST to one of the intermediate potential Vhh and the ground potential Vss according to an output of the inverter IV1.

With such a configuration, as shown in FIG. 10, the level converter sets a potential level of the control signal CST to the ground potential Vss in response to activation (L level)

of the control signal /CS and sets a potential level of the control signal CST to the intermediate potential Vhh in response to inactivation (H level) of the control signal /CS.

Referring again to FIG. 9, when in the operating state the transistor 120 is fully turned on by inputting such a control signal CST to the gate of the transistor 120 and supplies a sufficient current onto the power supply line 100. On the other hand, when in the standby state, a current amount corresponding to the H level potential Vhh of the control signal CST is supplied onto the power supply line 100 by the transistor 120.

Hence, the current limiter 250 can be one transistor. Further, in the current limiters 200 to 240 described in the first to third embodiments, a standby current is of a fixed value determined by a resistance value of a circuit element and a transistor size, whereas in the current limiter 250 according to the fourth embodiment, a standby current in the standby state can be controlled by the intermediate potential Vhh adjustable externally.

Modification of the Fourth Embodiment

Figure 13:
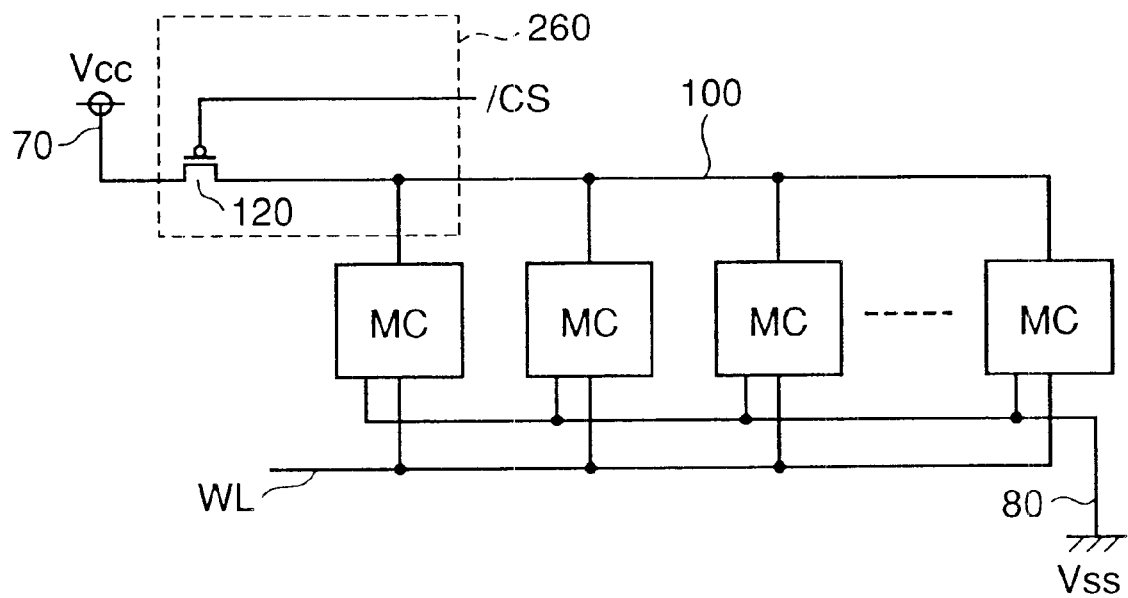
FIG. 13 is a circuit diagram representing a configuration of a current limiter 260 according to a modification of the fourth embodiment.

Referring to FIG. 13, a current limiter 260 according to the modification of the fourth embodiment includes: a P type MOS transistor 120 electrically coupled between a main power supply line 70 and a power supply line 100. A control signal ICS is inputted to the gate of the transistor 120.

In the operating state, since the control signal /CS is activated (L level), the transistor 120 enters the on state and supplies an operating current onto the power supply line 100. On the other hand, since in the standby state, the control signal /CS is inactivated (H level), the transistor 120 operates in the cutoff region (a subthreshold region), such that a current supply onto the power supply line 100 is performed only by a subthreshold current of the transistor 120.

Accordingly, when adjustment of a threshold value of the transistor 120, adoption of a depletion MOS transistor and others are done according to a current amount necessary in a memory cell array 40 in the standby state, then a desired standby current can be supplied by the transistor 120. Similar to the description in the third modification of the third embodiment, when a memory cell in the memory cell array 40 is constituted of a CMOS memory cell shown in FIG. 13, a standby current can be suppressed by decreasing a gate length of the P channel MOS transistor 120 by 10% or more, or reducing a threshold voltage by 0.1 V, relative to a gate length and a threshold voltage, respectively, of a P type transistor in the memory cell.

In such a way, since current amounts in the standby state and in the operating state can be adjusted at desired levels using any of the current limiters 250 and 260, each constituted of a single transistor, configurations are more advantageous in terms of layout.

Further, as in the second embodiment, the current limiter 210, 220, 230, 240, 250 or 260 shown in the third and fourth embodiments can be applied to a configuration in which one current limiter is provided to each set of a plurality of power supply lines.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having an operating state to perform reading and writing data and a standby state to hold a data, comprising:

a plurality of memory cells arranged in a matrix, each of said plurality of memory cells holding a data, receiving a first potential and a second potential corresponding to a high level and a low level, respectively, of said data;

a main power supply line supplying said first potential;

a first power supply line, placed in each of sections among said plurality of memory cells to supply said first potential to memory cells in said corresponding section;

a second power supply line supplying said second potential to said plurality of memory cells; and a current limiter provided between said main power supply line and said first power supply line in order to limit a current amount passing through said first power supply line below a prescribed value in said standby state.

2. The semiconductor memory device according to claim 1, wherein said prescribed value is determined depending on a standard value for a current consumed in the standby state.

3. The semiconductor memory device according to claim 1, wherein said current limiter includes a resistor electrically coupled between said main power supply line and said first power supply line, and said resistor has a resistance value determined depending on a difference between the first and second potentials, and said prescribed value.

4. The semiconductor memory device according to claim 1, wherein said current limiter includes:

a resistor, electrically coupled between said main power supply line and said first power supply line, and having a resistance value determined depending on a difference between the first and second potentials, and said prescribed value; and a transistor, connected in parallel to said resistor, and receiving a control signal having different signal levels for said standby state and said operating state, respectively, at a control electrode thereof, said transistor becoming conductive to supply an operating current onto said first power supply line in said operating state.

5. The semiconductor memory device according to claim 1, wherein said current includes:

a first transistor, electrically coupled between said main power supply line and said first power supply line, and receiving a control signal having different signal levels for said standby state and said operating state, respectively, at a control electrode thereof; and a second transistor, connected in parallel to said first transistor, and receiving a prescribed fixed potential at a control electrode thereof, wherein said first transistor becomes conductive to supply a first current amount onto said first power supply line in said operating state;

said second transistor supplies a second current amount smaller than said first current amount onto said first power supply line; and said second current amount is determined depending on a standard value for a current consumed in said standby state.

6. The semiconductor memory device according to claim 5, wherein said prescribed fixed potential corresponds to a signal level of said control signal in said operating state.

7. The semiconductor memory device according to claim 6, wherein said first and second transistors are of the same conductivity type as each other and said second transistor has a current driving capability smaller than the current driving capability of said first transistor.

8. The semiconductor memory device according to claim 5, wherein said prescribed fixed potential corresponds to a signal level of said control signal in said standby state.

9. The semiconductor memory device according to claim 8, wherein said first and second transistors are P type MOS transistors and said second current amount is supplied by a subthreshold current of said second transistor.

10. The semiconductor memory device according to claim 5, wherein signal levels corresponding to said operating state and said standby state of said control signal correspond to said second and first potentials, respectively, and said prescribed fixed potential is lower than said first potential and higher than said second potential.

11. The semiconductor memory device according to claim 10, wherein said first and second transistors are P type MOS transistors and said current limiter further comprises: a third transistor, being an N type MOS transistor, electrically coupled between said main power supply line and a gate of said second transistor, and receiving said first potential at a gate thereof.

12. The semiconductor memory device according to claim 1, further comprising:

an intermediate potential generator generating a third potential adjustable externally in a range lower than said first potential and higher than said second potential, wherein said current limiter includes:

a potential level converter generating a second control signal having signal levels of said third and second potentials corresponding to said standby state and said operating state, respectively, based on said first control signal having different signal levels for said standby state and said operating state, respectively; and a transistor, electrically coupled between said main power supply line and said first power supply line, and receiving said second control signal at a control electrode thereof.

13. The semiconductor memory device according to claim 1, wherein said current limiter is provided to each of said first power supply lines.

14. The semiconductor memory device according to claim 1, wherein said current limiter is provided to each of sets of a plurality of said first power supply lines.

15. The semiconductor memory device according to claim 1, wherein said each of sections corresponds to one memory cell row.

16. The semiconductor memory device according to claim 1, wherein said each of sections corresponds to one memory cell column.

17. The semiconductor memory device according to claim 1, wherein said each of sections corresponds to a plurality of memory cell rows.

18. The semiconductor memory device according to claim 1, wherein said each of sections corresponds to a plurality of memory cell columns.

19. The semiconductor memory device according to claim 1, wherein said current limiter includes a transistor, electrically coupled between said main power supply line and said first power supply line, and receiving a control signal having different signal levels for said standby state and said operating state, respectively, at a control electrode thereof and said transistor supplies a first current mount and a second current amount smaller than said first current amount onto said first power supply line in said operating state and said standby state, respectively.

20. The semiconductor memory device according to claim 19, wherein at least one of a threshold voltage and a transistor size of said second transistor is designed depending on a standard value for said second current consumed in the standby state.

* * * * *